United States Patent [19]
Palkovich

[11] Patent Number: 4,853,661
[45] Date of Patent: Aug. 1, 1989

[54] SUPERCONDUCTING MAGNET WITH SEPARATE SUPPORT SYSTEM

[75] Inventor: Alex Palkovich, Oxford, United Kingdom

[73] Assignee: Elscint Ltd., Haifa, Israel

[21] Appl. No.: 207,860

[22] Filed: Jun. 17, 1988

[30] Foreign Application Priority Data

Jun. 22, 1987 [IL] Israel .................................... 82950

[51] Int. Cl.⁴ ............................................ H01F 7/22
[52] U.S. Cl. .................................. 335/216; 335/300; 174/15.5
[58] Field of Search .................... 335/216, 299, 300; 174/15.4, 15.5; 324/318, 319, 320

[56] References Cited

U.S. PATENT DOCUMENTS

| | | | |
|---|---|---|---|
| 4,516,405 | 5/1985 | Laskaris | 62/55 |
| 4,587,504 | 5/1986 | Brown et al. | 335/216 |
| 4,590,428 | 5/1986 | Muller et al. | 324/320 |
| 4,721,934 | 1/1988 | Stacy | 335/300 |
| 4,743,880 | 5/1988 | Breneman et al. | 335/216 X |
| 4,771,256 | 9/1988 | Laskaris et al. | 335/216 X |
| 4,783,628 | 11/1988 | Huson | 335/216 X |

*Primary Examiner*—George Harris
*Attorney, Agent, or Firm*—Sandler & Greenblum

[57] ABSTRACT

A superconducting magnet arrangement for magnetic resonance systems including a cryomagnetic dewar containing magnetic coils in a helium vessel surrounded by a nitrogen vessel. A separate support structure is used to support the vessels in the dewar.

11 Claims, 3 Drawing Sheets

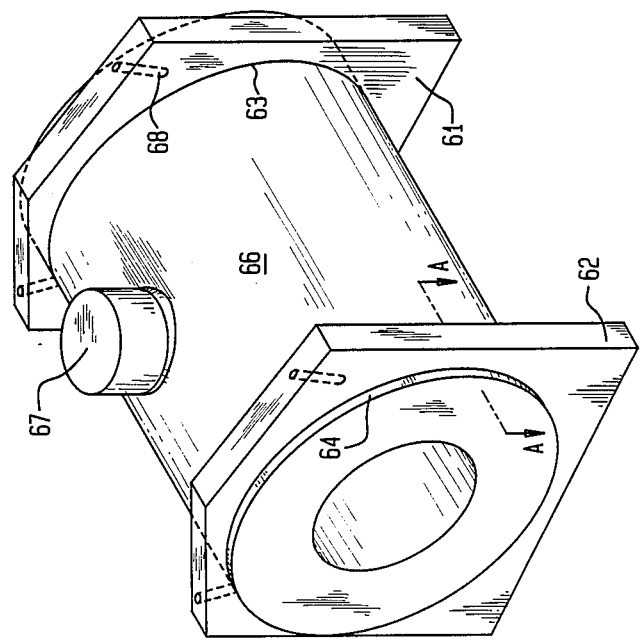

4,853,661

SUPERCONDUCTING MAGNET WITH SEPARATE SUPPORT SYSTEM

FIELD OF THE INVENTION

This invention is concerned with cryostats and more particularly with superconducting magnet arrangements for use in magnetic resonance (MR) systems.

BACKGROUND OF THE INVENTION

Magnetic resonance systems require static magnetic fields that are relatively strong, homogeneous and stable. It appears as if the best magnets for providing such fields are superconducting magnets. The magnet arrangement for MR systems require a coil system consisting of at least one circular cylindrical field coil to provide the large static homogenious field. In magnetic resonance imaging (MRI) systems at least one additional gradient coil is required to enable the location of the free induction decay (FID) signals that are used for imaging. In most present day systems, in fact, three gradient field coils are used. In addition radio frequency transmission and receiving coils are wound in the magnet. The receiving and transmitting coils can be a single coil.

The superconducting arrangement in the past generally has included a vacuum vessel or dewar container for preserving a vacuum and aiding in maintaining the low temperatures required for superconducting. In the dewar, there is provided a liquid helium container. The above enumerated magnetic coils are placed within the liquid helium to obtain superconductivity.

In the systems presently used the magnet system is a cylindrical arrangement having an internal central bore which receives the patient for imaging or spectograph analysis or both. In the general coil magnetic arrangement used for MR systems, the helium tank is surrounded by a gas cooled shield. Around the gas cooled shield is a nitrogen shield which extends from a liquid nitrogen container which is also located within the dewar and is radially external to the helium tank. Both tanks are located within the dewar between the bore and the radial outer dimension of the dewar.

In the prior art, the dewar has been made sufficiently strong to both act as the vacuum vessel and to support the magnetic system including the liquid nitrogen and liquid helium tanks and the coils arranged within the liquid helium tank. The prior art dewars have been strengthened by incorporating a frame onto the vacuum vessel and adding to the heft of the outer shell of the dewar. The prior art arrangement has thus required a relatively large mummber of welding operations to incorporate the frame and the vacuum vessel. The welding operations of course increase the costs of the cryostats well as decrease the reliability of the systems since welding joints are susceptable to leaks. Also, because of the strength needed to support the magnetic system in the past, it has been necessary to construct the vacuum vessels from relatively strong and expensive metals.

Accordingly, it is an object of scientists working in the field to find the means and methods for providing cryomagnetic arrangements for MRI systems wherein the vacuum vessel may be constructed of materials other than expensive and hard to work metals and in any event to be more reliable due to having less welds.

BRIEF DESCRIPTION OF THE INVENTION

In accordance with the present invention a superconducting magnet arrangement for MRI systems is provided, said arrangement comprising:
a cylindrical dewar,
a liquid helium vessel within the dewar,
coils for accomplishing magnetic resonance (MR) operations located within said liquid helium vessel,
a gas cooled shield surrounding said helium vessel,
a nitrogen vessel within said dewar radially removed from said helium vessel and further from the axis of said dewar than said helium vessel,
a nitrogen shield extending from said nitrogen vessel and having a portion located radially closer to the axis of said dewar than said helium tank,
said dewar functioning to maintain a vacuum but being non-supportive of the vessels therein, and
support means separate from said dewar supporting said vessels, shields and coils within said dewar.

In a related feature of the invention said support means includes outer support means and support rods extending from said outer support means into said dewar to the said vessels for supporting said vessels and means for extending the vacuum from the interior of the dewar to the ends of the support rods to reduce heat loss.

According to a further feature of the present invention the support means comprises end support plates made from plate material and having said dewar inserted therethrough to thereby independantly support said dewar.

According to yet another feature of the invention the support means comprises beam sections such as for example T-beams arranged at least at each end of said dewar for supporting said dewar and the systems used for the MR operations therein.

BRIEF DESCRIPTION OF THE DRAWINGS

The above named and other features and objects of the present invention will be best understood when considered in the light of the following description made in conjunction with the accompanying drawings; wherein:

FIG. 5 is pictorial drawing of yet another embodiment of the present inventive MR dewar support arrangement, and FIG. 5a is a sectional view taken at line A—A of FIG. 5 and looking in the direction of the arrows.

GENERAL DESCRIPTION

Figure 1:
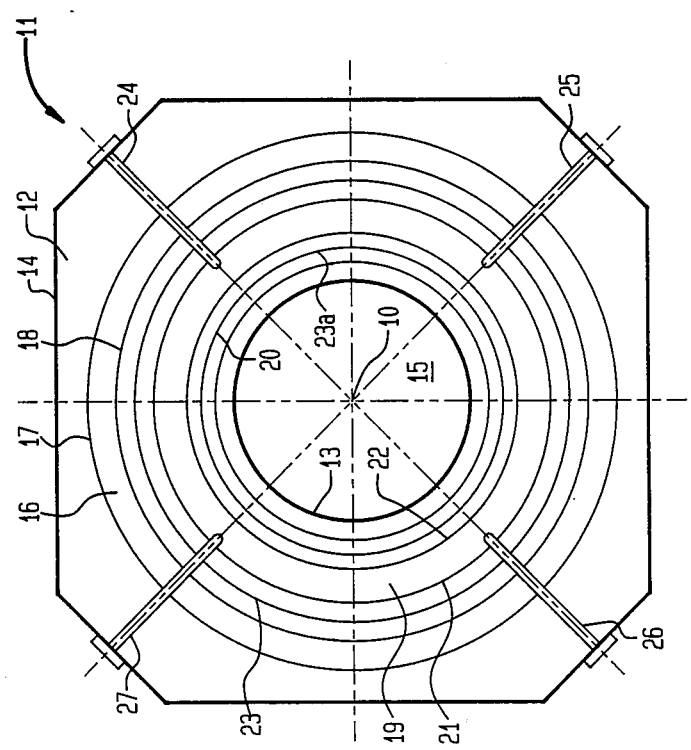
FIG. 1 is a sectional front view of a prior art dewar and integral support arrangement.

FIG. 1 shows the typical prior art vacuum vessel (dewar) with the support system integral to the dewar. Thus, in the prior art it is usual to have the dewar and supporting structure integrally associated in one unit. A prior art patent showing such an arrangement is U.S. Pat. No. 4,590,428 for example. Other prior art patents also pertinent to the invention herein are U.S. Pat. Nos. 4,587,504 and 4,516,405. The above noted patents are about magnet assemblies for use in MR apparatus and all show systems wherein the dewar vessel is made of sufficient structural strength to support the contents of the dewar.

The cryomagnetic arrangement 11 of FIG. 1 herein is representative of the prior art. It includes a cryostatic dewar 12 represented by the inner and outer lines shown at 13 and 14. These are the lines defining the extreme borders of the dewar. The line 13 defines the bore 15 of the MR superconducting magnet. The bore receives the patient for imaging or for spectroscopic purposes. The dewar contains a cross-sectionally toroidally shaped liquid nitrogen container 16 which is defined by the circles 17 and 18.

A cross-sectionally toroidally shaped helium container 19 is shown located radially closer to the axis 10 of the superconducting magnet then the liquid nitrogen container. The helium container 19 is defined by circles 21 and 22.

Extending from the nitrogen container 16 is a gas cooled shield 20 which surrounds the helium tank and is shown by the circle 20. The liquid gas containers are supported and held in place by the support rods, such as rod 24, which extends through the outer shell 14 of the vacuum vessel. There are 4 sets of support rods indicated in FIG. 1, by the presence of support rods 24, 25, 26 and 27. The system can have 2 or more sets of support rods.

The main difference between the prior art systems and the system to be described hereinafter is that the outer shell 14 of the prior art system is sufficiently strong and hefty to:
(a) support the contents of the vacuum vessel, and to
(b) hold the vacuum;
in other words the outer shell is designed to perform two different functions, i.e. maintain a vacuum and provide support for what is found within the cryostat.

This, of course, requires additional material and/or stronger material such as stainless steel or Aluminium. The stronger material in general costs more and provides strength and endurance for supporting the heavy contents of the dewar. Because of the integrated support and vacuum retaining functions of the dewar, vessel, the system requires welding on materials such as stainless steel or aluminium which is difficult, time consuming and which reduces the vacuum reliability of the system. The magnetic systems are particularly complicated for the high field cryomagnetics with weights up to 25,000 Kg.

Figure 2:
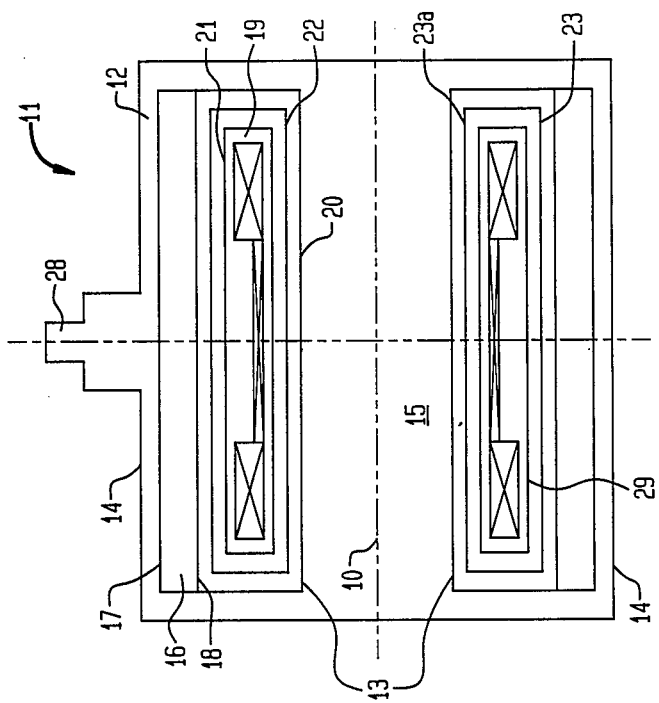
FIG. 2 is a sectional side view of a prior art dewar arrangement.

FIG. 2 is a side sectional view of the dewar of FIG. 1 with the contents therein to enhance the understanding of the system shown in FIG. 1. The system which includes the cryostat 12 having the outer shell 14 and the inner shell 13 defining the bore 15 is shown as having within the dewar the liquid nitrogen container 16 defined by the radially outer shell 17 and radially inner shell 18.

Similarly, the helium container 19 comprises the radially outer shell 21 and the radially inner shell 22. The helium container is surrounded by the gas cooled shield 23. Extending from the nitrogen tank 16 is the nitrogen shield 20. The nitrogen shield surrounds the gas cooled shield and the helium tank. The support rods are not shown in FIG. 2, however, coils are indicated at 29. The static field coils are shown arranged as Helmholtz coils. They could, however, be arranged as Garret coils, within the scope of the invention.

The cryostat includes a turret arrangement shown at 28 in FIG. 2. The turret arrangement includes a refrigerated type cooling system which extends into the interior of the system to draw heat away from the nitrogen shield and the gas cooled shield in a manner well known to those skilled in the cryostat art. See, for example, U.S. Pat. No. 4,537,033.

It should be noted that the cryostats are basically cylindrically shaped with circular cross sections; however, as indicated by FIG. 1 they can and do have a wide variety of cross sectional shapes.

Figure 4:
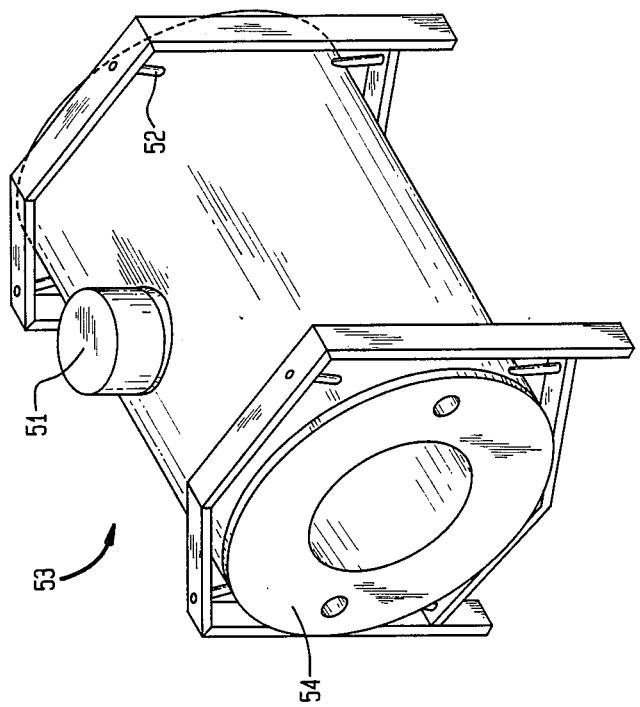
FIG. 4 is a pictorial drawing of another embodiment of the present inventive MR dewar support arrangement.
Figure 3:
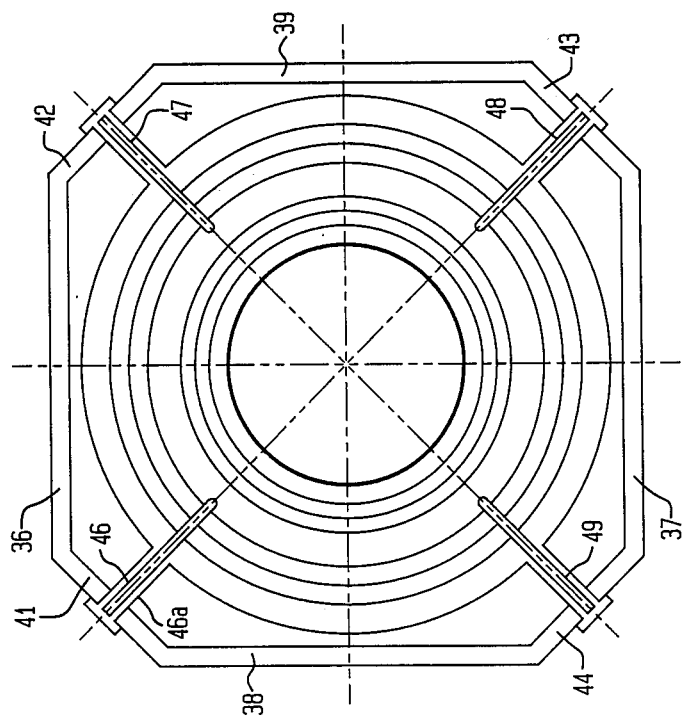
FIG. 3 is a sectional view of an embodiment of the inventive dewar for use in MR systems.

The drawing of FIG. 3 is a sectional view showing the inventive arrangement wherein the shell of the vacuum vessel is separate and apart from the supporting system. Thus, the support system is shown as comprising supports of structural sections made of structural beams, such as U-beams, I-beams or T-beams, shown in FIG. 3 as horizontal beams 36 and 37, vertical beams 38 and 39 and oblique beams 41, 42, 43 and 44. The support system can have this form or any other shape, say round, or be without horizontal beams as shown in FIG. 4, for example.

The drawing of FIG. 5 is a pictorial view of yet another embodiment where the supporting system is made from plates which can have almost any shape.

In a preferred embodiment four sets of support rods indicated by rods 46, 47, 48, and 49 are shown. The support rods 46, 47, 48, and 49 are enclosed within the vessel. That is, the dewar extends at section 46a to surround rod 46. Similarly the dewar extends around each of the rods to maintain a vacuum around the rods. This is done, in a preferred embodiment, to minimize heat loss through the support rods (a system can have a minimum of 2 supports).

It is noted that the nitrogen container and the helium container and the shields are contained within the dewar of FIG. 3 just as they were within the dewar of FIGS. 1 and 2.

FIG. 4 shows a variation of the embodiment of the support system of FIG. 3. Therein the support system is made from the structural steel elements previously mentioned. The system dewar itself is shown as having the well known turret arrangement shown at 51. The support rods such as such as rod 46 are contained within a vacuum which extends from the interior of the dewar vessel through extension 52. The dewar 54 of the cryomagnet arrangement 53 is readily seen in the drawing of FIG. 4.

The drawing of FIG. 5 shows yet another embodiment where plates such as plates 61 and 62 are shown as having apertures 63 and 64 therein for receiving the vacuum vessel 66. Here again the turret arrangement is shown at 67. The supporting rods are enclosed in vacuum in extensions such as extension 68, for example, and supported from the fabricated plates.

The plates 61 and 62 are preferably fabricated plates which can be made such as shown in the sectional view 5a from plates 70, 71 and 72. The plates 70, 71 and 72 can have other shapes, such as round, hexagonal etc. Similarly, the plates 61 and 62 can have a variety of shapes.

The interior of the vacuum vessels of FIGS. 3–5 is the same as the interior of the vacuum vessel in FIGS. 1 and 2. The only difference is that the outer shell does not require the strength necessary for supporting the coils and liquid gas containers located within the dewar. Therefore, the material of the inventive dewar with a separate support system does not have to be a material such as stainless steel it can even be a weaker material such as plastic; which among other things aids in eliminating eddy currents and the heating normally associated with eddy currents.

Thus with the support plates or structural elements, less material is used for the construction of the actual vacuum vessel and/or different, less costly and less hefty material is used for the actual construction of the vacuum vessel. The savings afforded by the inventive arrangement have proven startling. The cost of a unit has been reduced by about twenty per cent.

A further advantage of the inventive cryomagnet arrangement shown herein is for use in mobile MRI systems which are gaining in popularity and use. A separate support system is ideally suited for such mobile systems. In addition the separate support systems facilitate shipping the cryomagnet arrangement from the manufacturer to the site.

In operation then the cryomagnetic system of the invention uses a vacuum vessel that is separately reinforced for accompanying its support function. The support for the contents of the vacuum vessels is supplied by separate frames either of plate material or of structural material, thereby reducing the weight of the vacuum vessel considerably and increasing the system reliability. The inventive arrangement simplifies the system; reduces the number of vacuum welds and substantially reduces the cost of the dewar. Additionally eddy currents in the dewar shell are reduced.

While the invention has been described using preferred embodiments, it should be understood that the preferred embodiments were made by way of example and not as limitations on the scope of the invention.

What is claimed is:

1. A superconducting magnet arrangement for MRI systems comprising:
   a vacuum vessel,
   a liquid helium vessel within said vacuum vessel,
   magnetic coils for accomplishing magnetic resonance imaging (MRI), said coils being located within said liquid helium vessel,
   a nitrogen vessel within said vacuum vessel located further from the center of said vacuum vessel than said helium vessel,
   said vacuum vessel functioning to maintain an internal vacuum but being non-supportive of the vessels therein and separate from the vessels therein, and
   separate support means attached to said vacuum vessel for supporting said vacuum vessel and the contents of said vacuum vessel.

2. The superconducting magnet arrangement of claim 1 wherein said separate support means includes external support means external to said vacuum vessel, and
   support rods extending from said external support means to the interior of said vacuum vessel for supporting said helium vessel and nitrogen vessel within said vacuum vessel.

3. The superconducting magnet arrangement of claim 2 wherein said vacuum vessel extends to surrounds said support rods.

4. The superconducting magnet arrangement of claim 1 wherein said vacuum vessel is cylindrical having a centrally positioned bore therein for receiving subjects for MR operations.

5. The superconducting magnet arrangement of claim 4 wherein said helium and nitrogen vessels are toroidally shaped and centered about the axis of said cylindrical vacuum vessel.

6. The superconducting magnet arrangement of claim 1 wherein said separte support means comprise frame means at the ends of the vacuum vessel.

7. The superconducting magnet arrangement of claim 6 wherein said frame means is comprised of structural beams.

8. The superconducting magnet arrangement of claim 6 wherein said frame means is comprised of plates.

9. The superconducting magnet arrangement of claim 6 wherein said frame means are external to said vacuum vessel.

10. The superconducting magnet arrangement of claim 6 including rods extending from said frame means to attach to said helium vessel to support the contents of the vacuum vessel with said frame means.

11. The superconducting magnet arrangement of claim 10 wherein means are provided to include said rod means within the vacuum of said vacuum vessel.

* * * * *